(12) United States Patent
Kawano et al.

(10) Patent No.: US 9,730,363 B2
(45) Date of Patent: Aug. 8, 2017

(54) COMPOSITE MODULE

(71) Applicant: Murata Manufacturing Co., Ltd., Kyoto (JP)

(72) Inventors: Koji Kawano, Kyoto (JP); Naofumi Enkyo, Kyoto (JP); Koki Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/541,286

(22) Filed: Nov. 14, 2014

(65) Prior Publication Data

US 2015/0124409 A1    May 7, 2015

Related U.S. Application Data

(63) Continuation of application No. PCT/JP2013/062522, filed on Apr. 30, 2013.

(30) Foreign Application Priority Data

May 22, 2012  (JP) .................................. 2012-116983
Sep. 19, 2012  (JP) .................................. 2012-205312

(51) Int. Cl.
*H05K 7/20* (2006.01)
*H05K 5/02* (2006.01)
(Continued)

(52) U.S. Cl.
CPC ....... *H05K 7/20509* (2013.01); *H05K 5/0278* (2013.01); *H05K 7/026* (2013.01);
(Continued)

(58) Field of Classification Search
None
See application file for complete search history.

(56) References Cited

U.S. PATENT DOCUMENTS 7,382,625 B2 *  6/2008  Thornton .................. H01Q 1/22
                                                    235/492
7,407,390 B1 *  8/2008  Ni ..................... G06K 19/07732
                                                    361/752

(Continued)

FOREIGN PATENT DOCUMENTS

CN        102158573 A     8/2011
JP        2005-044904 A   2/2005
(Continued)

OTHER PUBLICATIONS

International Search Report issued in Application No. PCT/JP2013/062522 dated Jul. 16, 2013.

(Continued)

*Primary Examiner* — Courtney Smith
(74) *Attorney, Agent, or Firm* — Pearne & Gordon LLP (57) ABSTRACT

A wireless LAN module as a composite module according to the present invention includes a first substrate 26 and a second substrate 28 that is so disposed as opposed to the other principal surface 48b of the first substrate 26. An external connector 66 for the connection with an electronic apparatus is mounted on one principal surface 48a of the first substrate 26. An electronic component device 76a is mounted on one principal surface of the second substrate 28 in a region opposing the external connector 66 sandwiching the first substrate 26 therebetween. A heat dissipation member 78 is disposed on a surface which is an opposite side to the mounting-surface of the electronic component device 76a.

6 Claims, 7 Drawing Sheets

(51) Int. Cl.
*H05K 7/02* (2006.01)
*H04B 1/3888* (2015.01)
(52) U.S. Cl.
CPC ..... *H05K 7/20445* (2013.01); *H05K 7/20472* (2013.01); *H04B 1/3888* (2013.01)

(56) References Cited

U.S. PATENT DOCUMENTS

| | | | |
|---|---|---|---|
| 8,215,981 B2* | 7/2012 | Liu | G06F 13/382 |
| | | | 361/679.54 |
| 8,933,845 B2* | 1/2015 | Kim | H01Q 1/243 |
| | | | 343/702 |
| 2005/0018405 A1 | 1/2005 | Kawano | |
| 2009/0052142 A1* | 2/2009 | Brewer | H05K 1/144 |
| | | | 361/721 |
| 2011/0188207 A1* | 8/2011 | Won | G06F 1/20 |
| | | | 361/709 |
| 2012/0129481 A1* | 5/2012 | Hsu | H04B 1/3888 |
| | | | 455/347 |

FOREIGN PATENT DOCUMENTS

| | | |
|---|---|---|
| JP | 2006-135202 A | 5/2006 |
| JP | 2007-299338 A | 11/2007 |
| JP | 2010-211157 A | 9/2010 |
| JP | 2011-171252 A | 9/2011 |
| JP | 2011-198951 A | 10/2011 |
| JP | 2012-094695 A | 5/2012 |

OTHER PUBLICATIONS

Written Opinion issued in Application No. PCT/JP2013/062522 dated Jul. 16, 2013.

* cited by examiner

COMPOSITE MODULE

BACKGROUND OF THE INVENTION

Field of the Invention

The present invention relates to composite modules on which electronic component devices that generate high temperature heat are mounted, particularly to, for example, wireless LAN modules.

Description of the Related Art

Patent Document 1 discloses an electronic apparatus configured of two substrates, that is, configured of a multilayer substrate and a metal-based substrate on each of which electronic component devices are mounted. In the stated electronic apparatus, an electronic component device that generates heat is mounted on the multilayer substrate, and a heat dissipation sheet is disposed immediately above the electronic component device that generates heat (in other words, on a surface opposing a mounting-surface of the electronic component device). Further, Patent Document 1 discloses a structure in which heat generated from the electronic component device is dissipated to the metal-based substrate through the heat dissipation sheet. Employing such structure makes it possible to effectively dissipate heat generated from the electronic component device to the metal-based substrate, whereby the characteristics of the electronic component device can be prevented from being deteriorated due to the generated heat.

Patent Document 1: Japanese Unexamined Patent Application Publication No. 2006-135202

BRIEF SUMMARY OF THE INVENTION

However, the heat dissipation structure disclosed in Patent Document 1 has a problem such that heat accumulates inside the metal-based substrate unless the heat dissipated to the metal-based substrate from the electronic component device is further transferred to another place, resulting in that the heat in the electronic apparatus itself cannot be sufficiently dissipated. In addition, in a module provided with the above-described heat dissipation configuration or the like, as the module becomes smaller in size and shorter in height, substrates mounted therein such as a metal-based substrate and the like also become smaller in size. Accordingly, there have been such problems that the effect of heat dissipation is lowered, heat stays inside the module and cannot be sufficiently dissipated, and so on.

Accordingly, a primary object of the present invention is to provide a composite module that efficiently dissipates heat generated therein so as to make it possible to prevent the characteristics of the electronic component devices mounted in the module as well as the characteristics of the composite module from being deteriorated or the like.

A composite module according to an aspect of the present invention includes a first substrate and an external connector mounted on one principal surface of the first substrate, and an electronic component device is disposed in a region of another principal surface of the first substrate opposed to the external connector across the first substrate sandwiched therebetween.

In the composite module according to another aspect of the present invention, it is preferable that the electronic component device be mounted on the another principal surface of the first substrate.

It is preferable that the composite module according to another aspect of the present invention further include a second substrate disposed as opposed to the another principal surface of the first substrate, and that an electronic component device be mounted on one principal surface of the second substrate.

It is preferable that the composite module according to another aspect of the present invention further include a substrate joint connector configured to mechanically connect the first substrate and the second substrate together, the external connector be mounted on one end side of the first substrate, and the substrate joint connector be disposed on another end side of the another principal surface of the first substrate.

Further, in the composite module according to another aspect of the present invention, it is preferable that a heat dissipation member be disposed on a surface of the electronic component device opposite to a mounting-surface thereof.

Furthermore, in the composite module according to another aspect of the present invention, it is preferable that the heat dissipation member be so disposed as to make contact with both the surface of the electronic component device opposite to the mounting-surface thereof and the another principal surface of the first substrate.

Moreover, it is preferable that the composite module according to another aspect of the present invention further include an antenna and a housing, the housing accommodate the composite module and the antenna, and an inner wall surface of the housing make contact with the antenna via the composite module.

Still further, in the composite module according to another aspect of the present invention, it is preferable that a cutout configured to prevent at least one of the first substrate and the second substrate from making contact with the inner wall surface of the housing be provided in at least one of the first substrate and the second substrate at a portion in the vicinity of the electronic component device disposed in a region opposing the external connector sandwiching the first substrate therebetween.

The composite module according to the present invention includes an external connector mounted on one principal surface of the first substrate, and an electronic component device is disposed or mounted in a region of the other principal surface of the first substrate that opposes the external connector sandwiching the first substrate therebetween. Accordingly, the heat generated in the electronic component device is transferred to the external connector through the first substrate, and further the transferred heat is dissipated through the external connector to an electronic apparatus that is connected with the composite module, whereby the heat generate in the electronic component device can be efficiently dissipated.

In addition, the composite module according to the present invention further includes a second substrate so disposed as opposed to the other principal surface of the first substrate; in the case where an electronic component device is mounted on one principal surface of the second substrate, the heat generated in the electronic component device is transferred not only to the external connector through the first substrate but also to the second substrate, whereby the heat generated in the electronic component device can be further efficiently dissipated.

Further, the composite module according to the present invention includes a substrate-joint connector configured to mechanically connect the first substrate and the second substrate together, the external connector is mounted on one end side of the first substrate, and the substrate joint connector is disposed on the other end side of the other principal surface of the first substrate. Therefore, mechanical strength of the composite module is enhanced, heat capacity is raised by an amount due to the mounting of the substrate joint connector, and transfer of the heat generated in the electronic component device from the second substrate to the first substrate can be efficiently carried out through the substrate joint connector. This makes it possible to further efficiently dissipate the heat generated in the electronic component device.

Still further, in the composite module according to the present invention, a heat dissipation member is disposed on a surface of the electronic component device opposite to a mounting-surface thereof, or the heat dissipation member is so disposed as to make contact with both the surface of the electronic component device opposite to the mounting-surface thereof and the other principal surface of the first substrate. Accordingly, the heat generated in the electronic component device is transferred to the heat dissipation member, and the heat transferred to the heat dissipation member is further transferred to the external connector so that heat is dissipated through the external connector to an electronic apparatus with which the composite module is connected, whereby the heat generated in the electronic component device can be further efficiently dissipated.

Moreover, because the composite module according to the present invention further includes an antenna and a housing, the housing accommodates the composite module and the antenna, and an inner wall surface of the housing makes contact with the antenna via the composite module, the above-mentioned effect can be obtained. In addition, heat capacity of the composite module is raised, and the heat generated in the electronic component device is dissipated to the housing side via the antenna, whereby the heat generated in the electronic component device can be further efficiently dissipated.

Still further, in the composite module according to the present invention, a cutout configured to prevent at least one of the first substrate and the second substrate from making contact with the inner wall surface of the housing is provided in at least one of the first substrate and the second substrate at a portion in the vicinity of the electronic component device disposed in a region that opposes the external connector sandwiching the first substrate therebetween. Accordingly, the composite module can have a structure in which the heat generated from the electronic component device is efficiently dissipated through the external connector while the heat is made unlikely to be directly dissipated toward the housing side from at least one of the first substrate and the second substrate.

According to the present invention, it is possible to provide a composite module that efficiently dissipates the heat generated therein so as to make it possible to prevent the characteristics of the electronic component devices mounted on the module as well as the characteristics of the composite module from being deteriorated and so on.

The above-mentioned primary object of the present invention as well as other objects, features, and advantages thereof will be further clarified through the following description, with reference to the appended drawings, of embodiments in which the present invention is embodied.

BRIEF DESCRIPTION OF THE SEVERAL VIEWS OF THE DRAWINGS

FIGS. 3A and 3B are plan views of a substrate section in the wireless LAN module according to the first embodiment of the present invention, where FIG. 3A is a plan view of a first substrate and FIG. 3A is a plan view of a second substrate.

FIG. 6A is a cross-sectional plan view of the wireless LAN module according to the third embodiment of the present invention, taken along an A-A line in FIG. 5; while

FIG. 7A is a schematic cross-sectional view of a wireless LAN module according to a fourth embodiment of the present invention, while

DETAILED DESCRIPTION OF THE INVENTION

Figure 1:
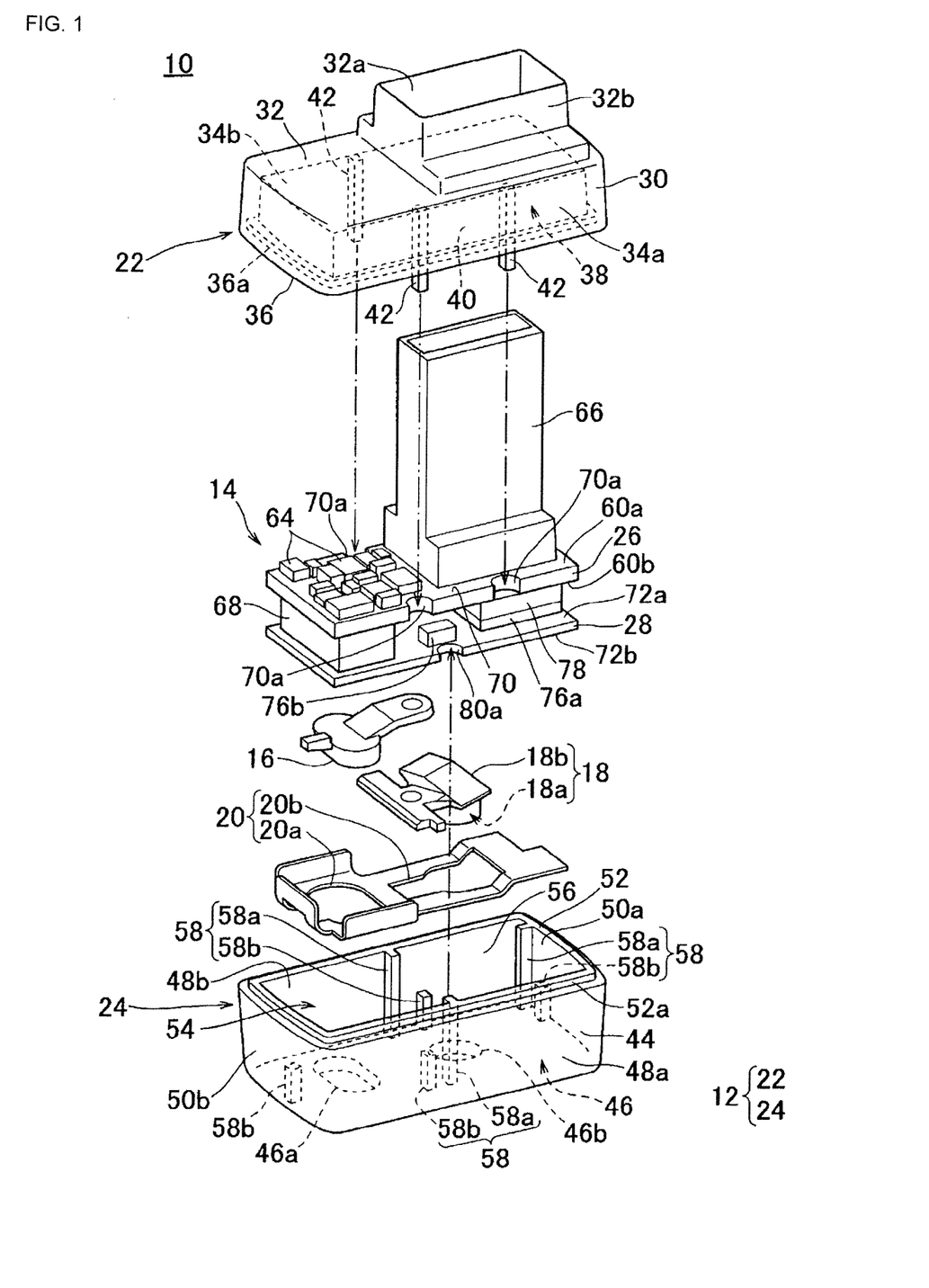
FIG. 1 is an exploded perspective view of a wireless LAN module according to a first embodiment of the present invention.
Figure 2:
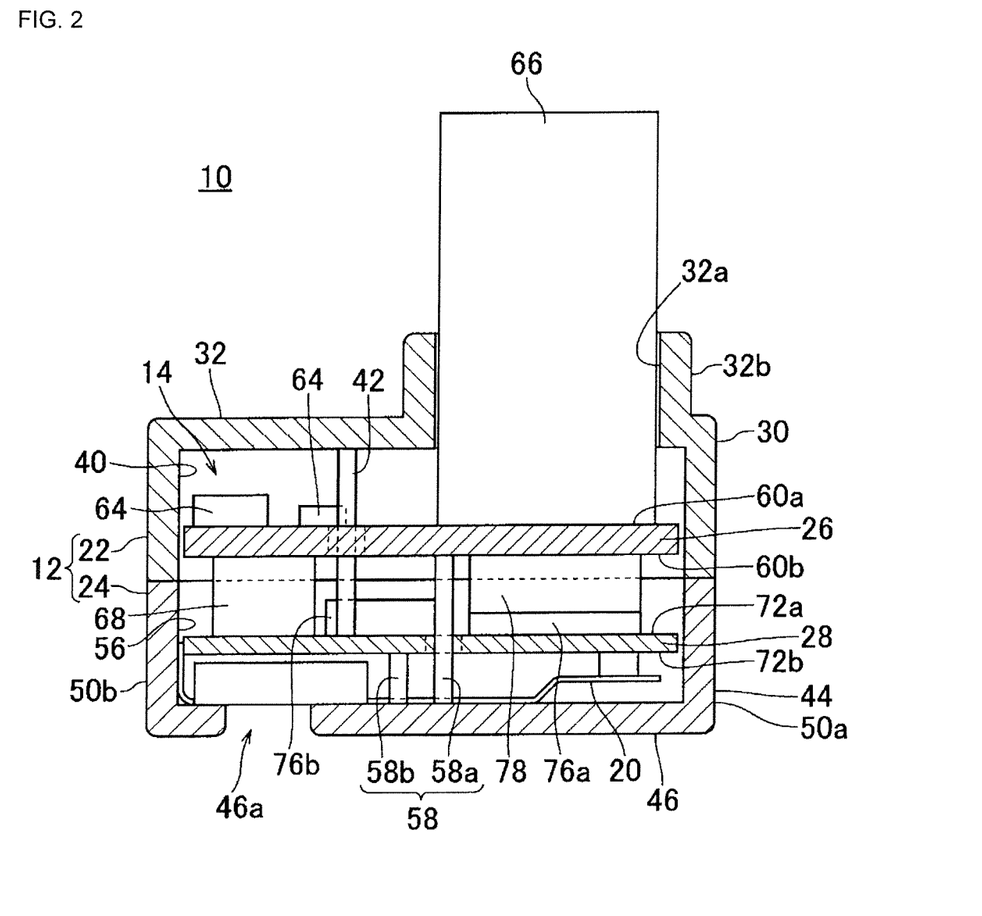
FIG. 2 is a schematic cross-sectional view of the wireless LAN module according to the first embodiment of the present invention.

Hereinafter, an example of a wireless LAN module as a composite module according to an embodiment of the present invention will be described. FIG. 1 is an exploded perspective view of a wireless LAN module according to a first embodiment of the present invention. FIG. 2 is a schematic cross-sectional view of the wireless LAN module according to the first embodiment of the present invention. A wireless LAN module 10 in the drawing is a module that is configured to, when connected with an electronic apparatus, provide the electronic apparatus with a function of wireless communication, for example.

The wireless LAN module 10 shown in FIG. 1 includes at least a housing 12 and a substrate section 14. The wireless LAN module 10 further includes a button member 16, a lens member 18, and an antenna 20.

The housing 12 is provided to accommodate at least the substrate section 14. Further, the housing 12 is provided to accommodate the button member 16, the lens member 18, and the antenna 20. The housing 12 is formed in a parallelepiped shape. The housing 12 includes a first housing 22 and a second housing 24. Here, the substrate section 14 includes, for example, a first substrate 26 and a second substrate 28.

The first housing 22 is formed in a box shape configured of a side surface portion 30 and an upper surface portion 32. The side surface portion 30 of the first housing 22 includes one side surface 34a and the other side surface 34b that extend along a long side direction and a height direction. The one side surface 34a and the other side surface 34b are so formed as opposed to each other.

A rectangular opening portion 36 is formed on the lower side of the first housing 22 (on the side opposing to the upper surface portion 32). A groove 36a with its cross section being L-shaped is formed along an inner side surface of the opening portion 36. A projecting edge portion 52a of the second housing 24, which will be explained later, is fitted into the groove 36a when the first housing 22 and the second housing 24 are combined to form the housing 12.

An accommodation section 38 is provided inside the box-shaped portion configured of the side surface portion 30 and the upper surface portion 32 of the first housing 22. An inner wall surface 40 is formed on a surface of the side surface portion 30 at the accommodation section 38 side.

A plurality of substrate-support projections 42 configured to support the substrate section 14 are formed on the inner wall surface 40. Each of the substrate-support projections 42 is formed in a bar shape whose cross section is substantially circular and has one end and the other end. The substrate-support projections 42 formed in the first housing 22 are so provided as to press and support one principal surface 72a of the second substrate 28 in the substrate section 14.

In the present embodiment, the substrate-support projections 42 are formed in two separate locations at a predetermined interval on the inner wall surface 40 of the one side surface 34a in the first housing 22, and in one location on the inner wall surface 40 of the other side surface 34b, respectively. The substrate-support projection 42 is formed to have a longer length than the length from the upper surface portion 32 down to the opening portion 36, for example, and this length of the projection determines a position of the second substrate 28 in a thickness direction thereof inside the housing 12.

A connector opening portion 32a is formed in the upper surface portion 32 of the first housing 22. The connector opening portion 32a is formed so that an external connector 66, which will be explained later, is inserted therethrough and mounted. A cylindrical portion 32b is formed in a cylinder shape in the connector opening portion 32a so as to support the external connector 66.

The second housing 24 is formed in a box shape configured of a side surface portion 44 and a bottom surface portion 46. The side surface portion 44 of the second housing 24 includes one side surface 48a and the other side surface 48b that extend along the long side direction and the height direction, and also includes one end surface 50a and the other end surface 50b that extend along a short side direction and the height direction. The one side surface 48a and the other side surface 48b are so formed as opposed to each other, and the one end surface 50a and the other end surface 50b are also so formed as opposed to each other. Further, a button opening portion 46a and a lens opening portion 46b are formed in the bottom surface portion 46.

A rectangular opening portion 52 is formed on the upper side of the second housing 24 (on the side opposing to the bottom surface portion 46). The projecting edge portion 52a is formed along an edge at substantially the inside of the opening portion 52. The projecting edge portion 52a is fitted into the above-mentioned groove 36a of the first housing 22 when the first housing 22 and the second housing 24 are combined to form the housing 12.

An accommodation section 54 is provided inside the box-shaped portion configured of the side surface portion 44 and the bottom surface portion 46 of the second housing 24. An inner wall surface 56 is formed on a surface of the side surface portion 44 at the accommodation section 54 side.

A plurality of substrate-support projections 58 configured to support the substrate section 14 are formed on the inner wall surface 56. Each of the substrate-support projections 58 formed in the second housing 24 includes a first substrate-support projection 58a configured to hold and support the first substrate 26 of the substrate section 14 and a second substrate-support projection 58b configured to hold and support the second substrate 28 of the substrate section 14. The first substrate-support projection 58a and the second substrate-support projection 58b are each formed in a bar shape whose cross section is substantially circular and each have one end and the other end.

In the present embodiment, the first substrate-support projections 58a are formed in a location on the inner wall surface 56 of the one side surface 48a, a location on the inner wall surface 56 of the other side surface 48b, and a location on the inner wall surface 56 of the one end surface 50a of the second housing 24, respectively. Each of the first substrate-support projections 58a is formed to have a length extending from the bottom surface portion 46 up to the opening portion 52 of the second housing 24, for example. The lengths of the first substrate-support projections 58a are the same. The length of the first substrate-support projection 58a determines a position of the first substrate 26 in a thickness direction thereof inside the housing 12. Further, in the second housing 24, the second substrate-support projections 58b are formed in a location on the inner wall surface 56 of the one side surface 48a, a location on the inner wall surface 56 of the other side surface 48b, a location on the inner wall surface 56 of the one end surface 50a, and a location on the inner wall surface 56 of the other end surface 50b, respectively, in a manner in which the locations of the second substrate-support projections 58b are different from those of the corresponding first substrate-support projections 58a, in other words, the first and second substrate-support projections 58a and 58b are provided at predetermined intervals therebetween. Each of the second substrate-support projections 58b is formed to have a length which is halfway the length from the bottom surface portion 46 up to the opening portion 52 of the second housing 24, for example. The lengths of the second substrate-support projections 58b are the same. The length of each of the second substrate-support projections 58b determines a position of the second substrate 28 in the thickness direction thereof inside the housing 12.

Figure 3A:
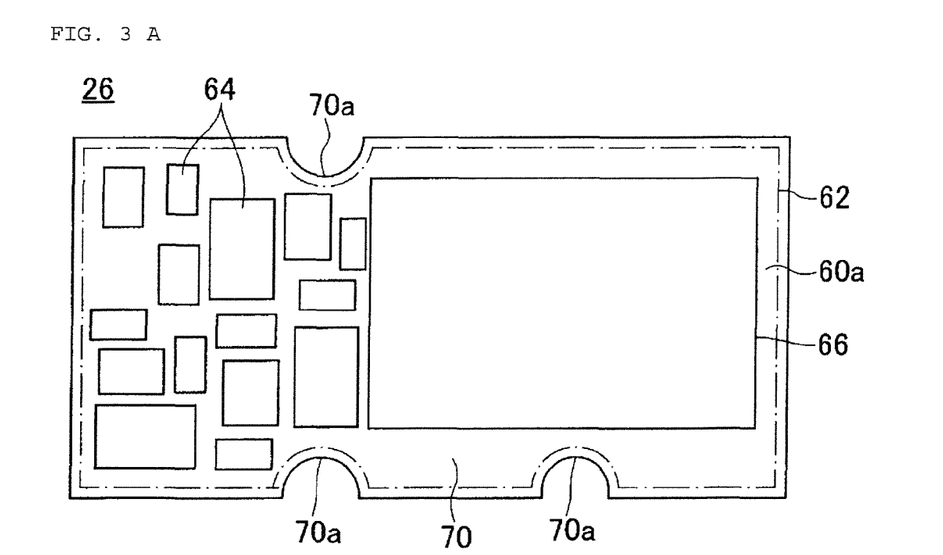
Figure 3B:
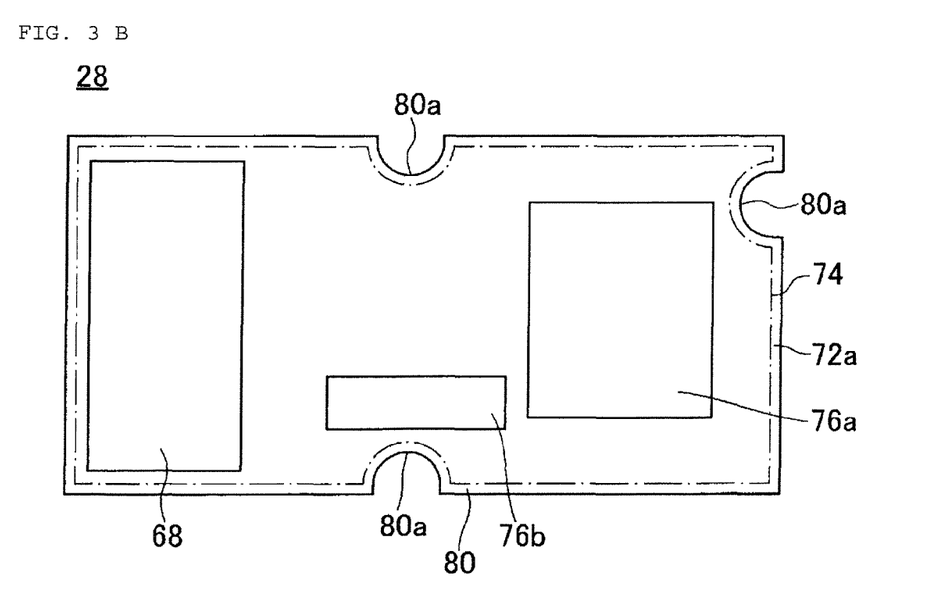

Next, the substrate section 14 will be described below. FIGS. 3A and 3B are plan views of the substrate section in the wireless LAN module according to the first embodiment of the present invention. FIG. 3A is a plan view of the first substrate, while FIG. 3B is a plan view of the second substrate. The substrate section 14 includes the first substrate 26 and the second substrate 28. The first substrate 26 and the second substrate 28 are formed of, for example, print substrates or the like. The first substrate 26 is formed to have a larger thickness than the second substrate 28.

The first substrate 26 is formed in a rectangular plate shape, and includes one principal surface 60a and the other principal surface 60b. A first function block 62 configured to implement a predetermined function is disposed on the one principal surface 60a of the first substrate 26, having a wiring pattern (not shown) and mounting electronic component devices 64 therein. The electronic component devices 64 mounted in the function block 62 include, for example, electronic component devices 64 related to a power supply circuit. The electronic component devices 64 are, for example, coil components such as DC-DC converters and the like. Accordingly, the electronic component devices 64 related to the power supply circuit and the like that are mounted in the first function block 62 are so arranged as opposed to the upper surface portion 32 of the first housing 22 when the first substrate 26 is accommodated in the housing 12. Further, the external connector 66 is mounted in a region which is on one end portion side of the one principal surface 60a of the first substrate 26 and which is other than an area where the electronic component devices 64 related to the power supply circuit and the like are mounted in the first function block 62. A 5-pin or 8-pin USB connector is used for the external connector 66. A substrate joint connector 68 is provided on the other end side of the other principal surface 60*b* of the first substrate 26 so as to mechanically connect the first substrate 26 and the second substrate 28 together at a desired interval therebetween in the thickness direction of the respective substrates.

An edge portion 70 is provided along an outer circumference of the first substrate 26. A plurality of recesses 70*a* having a semicircular shape are provided in the edge portion 70 of the first substrate 26 corresponding to the substrate-support projections 42 formed in the first housing 22, for example. The recesses 70*a* are provided in a total of three locations, for example, on the long sides in the edge portion 70. Accordingly, the substrate-support projections 42 formed in the first housing 22 are inserted through the recesses 70*a* and mounted. Then, the edge portion 70 of the other principal surface 60*b* of the first substrate 26 is supported as being held by one end of each of the first substrate-support projections 58*a* formed in three locations on the inner wall surface 56 of the second housing 24.

The second substrate 28 is formed in a rectangular plate shape, and includes the one principal surface 72*a* and the other principal surface 72*b*. The one principal surface 72*a* of the second substrate 28 is so disposed as opposed to the other principal surface 60*b* of the first substrate 26 at a desired interval therebetween in the thickness direction of the respective substrates via the substrate joint connector 68. The size of the outer shape of the second substrate 28 is approximately the same as that of the first substrate 26. A second function block 74 configured to implement a predetermined function which is different from the function of the first function block 62 is disposed on the one principal surface 72*a* of the second substrate 28, having a wiring pattern (not shown) and mounting electronic component devices 76*a* and 76*b* therein. Because the electronic component devices 64 mounted in the first function block 62 and the electronic component devices 76*a* and 76*b* mounted in the second function block 74 are arranged, for example, so as to sandwich the first substrate 26 therebetween, the electronic component devices mounted in the respective function blocks are arranged so as not to directly oppose each other.

As the electronic component devices 76*a* and 76*b* mounted in the second function block 74, electronic component devices related to control circuits such as a wireless LAN IC, a micro control unit (MCU), and so on can be cited, for example. The electronic component device 76*a* is disposed on the one principal surface 72*a* of the second substrate 28, which is a region opposing the one principal surface 60*a* of the first substrate 26 on which the external connector 66 is mounted while sandwiching the first substrate 26 therebetween. In other words, the electronic component device 76*a* is mounted on the one principal surface 72*a* of the second substrate 28, which is a region on a side immediately under the surface where the external connector 66 is mounted. Note that the electronic component device 76*a* mounted in the second function block 74 is an electronic component device that generates a relatively high temperature heat.

Here, for example, in the case where the operation of writing into a ROM that is included in the MCU is executed, the writing and reading modes are set in a hardware-controlled manner in which the terminal mode-setting is made by potential at a setting terminal. Accordingly, by drawing out a setting terminal necessary for the terminal mode-setting to the substrate joint connector 68, the terminal mode-setting (potential) can be set to the writing mode at a time of testing a single substrate, and set to the reading mode in a connector board of the composite module.

Because the first substrate 26 on which the external connector 66 is mounted is formed to be thicker in dimension than the second substrate 28, the composite module can accept a load applied thereto at a time when plugging into the external connector 66 is performed. In addition, since the second substrate 28 is formed thinner, the wiring precision can be improved and the through-holes formed in the second substrate 28 can be made smaller. Moreover, since the second substrate 28 is formed thinner, the thickness of the overall composite module 10 can be made smaller, thereby making it possible to miniaturize the composite module 10.

In the substrate section 14, the first function block 62 is disposed in the first substrate 26, and the second function block 74 is disposed in the second substrate 28, which is distanced from the first substrate 26. This can reduce the interference of the signals or the like between the two function blocks. In addition, because the first function block 62 and the second function block 74 are disposed so as not to directly oppose each other, it is possible to further enhance an effect of reducing the above-mentioned interference. Accordingly, the electric characteristics of the wireless LAN module 10 can be prevented from being deteriorated.

Further, because the electronic component devices 64 related to a power supply circuit, such as coil components or a DC-DC converter or the like, are included in the first function block 62, a magnetic field generated by the coil components can cause coupling with the electronic component devices of the other function block. However, because the upper surface portion 32 of the first housing 22 and the electronic component devices 64 related to the power supply circuit and the like that are mounted in the first function block 62 are so arranged as opposed to each other when the first substrate 26 is accommodated in the housing 12, the coupling with other electronic component devices accommodated within the housing 12 can be suppressed.

Furthermore, the external connector 66 is mounted in a region which is on the one end portion side of the one principal surface 60*a* of the first substrate 26 and which is other than an area where the electronic component devices 64 related to the power supply circuit and the like are mounted in the first function block 62. This makes it possible to further enhance the effect of suppressing the interference between the function blocks because the external connector 66 suppresses the spread of a magnetic field generated in the electronic component devices 64 related to the power supply circuit, such as coil components of a DC-DC converter or the like, in the first function block 62.

Moreover, a ground electrode may be provided on the one principal surface 60*a* of the first substrate 26 or at the inside of the first substrate 26; in addition, the ground electrode (not shown) may be provided on the one principal surface 72*a* of the second substrate 28 or at the inside of the second substrate 28. With the ground electrode formed on the first substrate 26 or the second substrate 28, the interference between a function block in an area surrounded by the ground electrode and a function block in an area not surrounded by the ground electrode can be reduced. Accordingly, the electric characteristics of the wireless LAN module 10 can be further prevented from being deteriorated.

A heat dissipation member 78 is disposed on an upper surface of the electronic component device 76*a* (in other words, a surface on the opposite side to the surface where the electronic component device 76*a* is mounted on the second substrate 28). The heat dissipation member 78 has a function to absorb the heat generated in the electronic component device 76*a* and serves as a buffer with respect to the first substrate 26 and the second substrate 28. The heat dissipation member 78 is disposed between the first substrate 26 and the second substrate 28. A surface of the heat dissipation member 78 on the opposite side to the upper surface of the electronic component device 76a is in contact with the other principal surface 60b of the first substrate 26. Accordingly, the heat dissipation member 78 is so disposed as opposed to a lower surface of the external connector 66 sandwiching the first substrate 26 therebetween. In addition, the heat dissipation member 78 has a size capable of covering at least the upper surface of the electronic component device 76a. As a material of the heat dissipation member 78, a resin with high thermal conductivity is used, that is, a silicon resin containing ceramics-based or metal-based filler is preferably used, for example.

An edge portion 80 is provided along an outer circumference of the second substrate 28. A plurality of recesses 80a having a semicircular shape are provided in the edge portion 80 of the second substrate 28 corresponding to the first substrate-support projections 58a formed in the second housing 24, for example. The recesses 80a are provided in a total of three locations, for example, on the sides in the edge portion 80 except the other end side where the substrate joint connector 68 is provided. Accordingly, the first substrate-support projections 58a are inserted through the recesses 80a and mounted. Then, the edge portion 80 of the one principal surface 72a of the second substrate 28 is supported as being pressed by one end of each of the substrate-support projections 42 formed on the inner wall surface 40 of the first housing 22; the other principal surface 72b of the second substrate 28 is supported as being held by one end of each of the second substrate-support projections 58b formed on the inner wall surface 56 of the second housing 24. Note that the positions at which the edge portion 80 of the one principal surface 72a of the second substrate 28 is supported as being pressed by the one end of each of the substrate-support projections 42 formed on the inner wall surface 40 of the first housing 22, and the positions at which the edge portion 80 of the other principal surface 72b of the second substrate 28 is supported as being held by the one end of each of the second substrate-support projections 58b formed on the inner wall surface 56 of the second housing 24, are different from one another in the second substrate 28 when viewing the second substrate 28 from above.

Note that the edge portion 70 of the other principal surface 60b of the first substrate 26 is supported as being held by the one end of each of the first substrate-support projections 58a formed in three locations on the inner wall surface 56 of the second housing 24, the edge portion 80 of the one principal surface 72a of the second substrate 28 is supported as being pressed by the one end of each of the substrate-support projections 42 formed on the inner wall surface 40 of the first housing 22, and the other principal surface 72b of the second substrate 28 is supported as being held by the one end of each of the second substrate-support projections 58b formed on the inner wall surface 56 of the second housing 24. Therefore, the first substrate 26 and the second substrate 28 are surely supported inside the housing 12 without being deformed.

Further, the positions at which the edge portion 80 of the one principal surface 72a of the second substrate 28 is supported as being pressed by the one end of each of the substrate-support projections 42 formed on the inner wall surface 40 of the first housing 22, and the positions at which the other principal surface 72b of the second substrate 28 is supported as being held by the one end of each of the second substrate-support projections 58b formed on the inner wall surface 56 of the second housing 24, are different from one another in the second substrate 28 when viewing the second substrate 28 from above. Accordingly, the strength in support of the substrate can be enhanced in comparison with a case in which the substrate is supported at the same positions.

Furthermore, the plurality of recesses 80a having a semicircular shape are provided on the sides, except the other end side where the substrate joint connector 68 is provided, in the edge portion 80 of the second substrate 28 corresponding to the first substrate-support projections 58a formed in the second housing 24. Since the first substrate-support projections 58a are inserted through the recesses 80a and mounted, the position of the second substrate 28 is fixed by the first substrate-support projections 58a with respect to the long side and short side directions of the second substrate 28, whereby an improved mounting precision of the second substrate 28 within the housing 12 can be obtained.

In the case where only the external connector 66 needs to be changed, the change thereof can be carried out only by changing the first substrate 26 on which the external connector 66 is mounted, without changing the second substrate 28 on which the electronic component devices 76a, 76b related to the control circuits and the like are mounted.

The button member 16 is provided to execute, for example, a starting operation or reset operation for communication when performing the ID certification with a connection destination apparatus with which the wireless connection is established using the wireless LAN module 10, and so on.

The lens member 18 includes a lens 18a and a lens holder 18b. The lens 18a is provided to lead a light from an LED lamp (not shown) indicating an operation state of the wireless LAN module 10 to the exterior of the housing 12. The lens holder 18b is provided to hold the lens 18a.

The antenna 20 is provided to transmit/receive the radio waves through which the wireless communication is carried out with external wireless LAN terminals or the like. The antenna 20 is formed in a rectangular plate shape, and a button opening portion 20a and a lens opening portion 20b are formed therein. The antenna 20 is disposed on the other principal surface 72b side of the second substrate 28, for example. The antenna 20 is so disposed as to make contact with the bottom surface portion 46 of the second housing 24 when the antenna 20 is accommodated in the housing 12.

In the wireless LAN module 10 according to the first embodiment, the heat that is generated in the electronic component device 76a is dissipated as follows. That is, since the heat dissipation member 78 is formed of a resin with high thermal conductivity, the heat generated in the electronic component device 76a is efficiently absorbed by the heat dissipation member 78. Subsequently, the absorbed heat by the heat dissipation member 78 is transferred to the external connector 66 through the first substrate 26. Then, the heat transferred to the external connector 66 is dissipated, through the external connector 66, to an electronic apparatus to which the wireless LAN module 10 is connected. In addition, the heat generated in the electronic component device 76a is transferred to the second substrate 28, and is further transferred toward the first substrate 26 side via the substrate joint connector 68.

With the wireless LAN module 10 according to the present invention, as described above, the heat generated in the electronic component device 76a is absorbed by the heat dissipation member 78, and the absorbed heat is transferred to the external connector 66 so as to be dissipated, through the external connector 66, to an electronic apparatus to which the wireless LAN module 10 is connected. Accordingly, because the heat generated in the electronic component device 76a can be efficiently dissipated, the characteristics of the various electronic component devices mounted in the module and the characteristics of the wireless LAN module 10 can be prevented from being deteriorated.

With the wireless LAN module 10 according to the present invention, providing the substrate joint connector 68 between the other principal surface 60b of the first substrate 26 and the one principal surface 72a of the second substrate 28 so as to connect the stated substrates together, makes it possible to increase the heat capacity of the substrate section 14; in addition, because the heat generated in the electronic component device 76a can be transferred toward the first substrate 26 through the substrate joint connector 68, the heat generated in the electronic component device 76a can be efficiently dissipated.

Further, with the wireless LAN module 10 according to the present invention, the substrate section 14 mainly makes contact with the housing 12 via the substrate-support projections 42 and 58; the antenna 20 is disposed on the other principal surface 72b side of the second substrate 28, and is so disposed as to make contact with the bottom surface portion 46 of the second housing 24 when it is accommodated in the housing 12. Accordingly, the heat generated in the electronic component device 76a can be dissipated to the housing 12. This makes it possible to further efficiently dissipate the heat generated inside the wireless LAN module 10.

Figure 4:
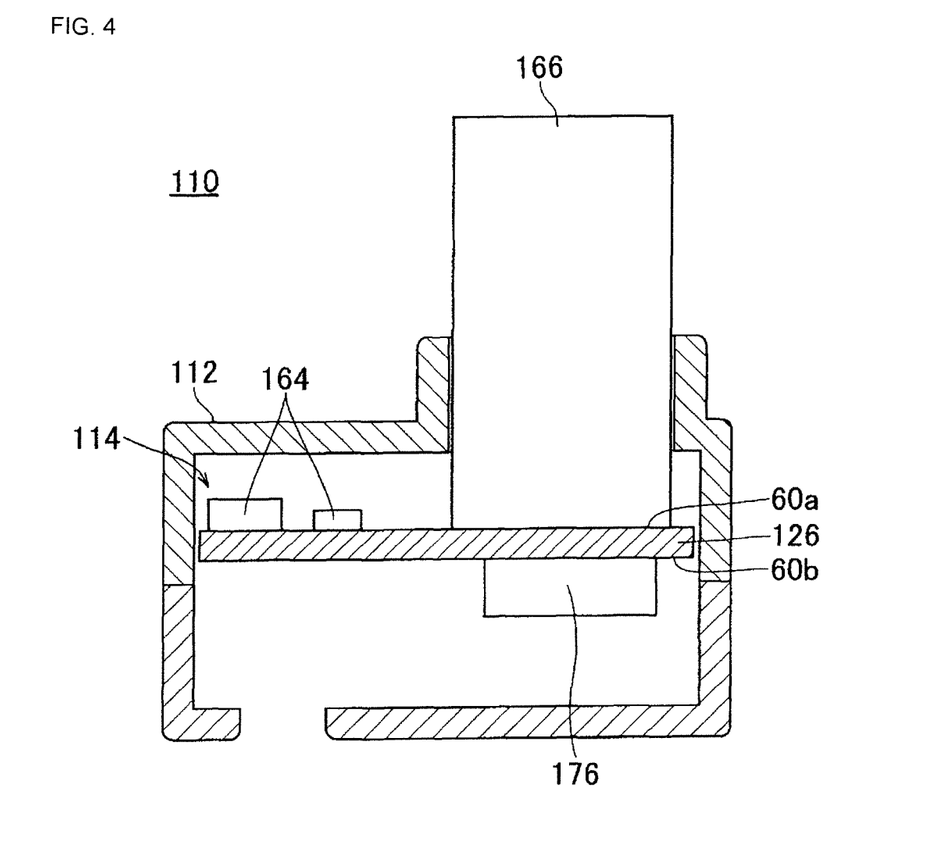
FIG. 4 is a schematic cross-sectional view of a wireless LAN module according to a second embodiment of the present invention.

Next, a wireless LAN module according to a second embodiment of the present invention will be described. FIG. 4 is a schematic cross-sectional view of a wireless LAN module according to the second embodiment of the present invention.

A wireless LAN module 110 shown in FIG. 4 includes at least a housing 112 and a substrate section 114.

The housing 112 is provided at least to accommodate the substrate section 114. Because the configuration of the housing 112 is the same as that of the housing 12 in the first embodiment, the description thereof is omitted herein. Further, the description of the substrate-support projections configured to support the substrate section 114 is also omitted.

The substrate section 114 includes a first substrate 126. The first substrate 126 is formed with, for example, a print substrate or the like. The first substrate 126 is formed in a rectangular plate shape, and includes one principal surface 60a and the other principal surface 60b.

A first function block configured to implement a predetermined function is disposed on the one principal surface 60a of the first substrate 126, having a wiring pattern (not shown) and mounting the electronic component devices 164 therein. Further, an external connector 166 is mounted in a region which is on one end portion side of the one principal surface 60a of the first substrate 126 and which is other than an area where the electronic component devices 164 are mounted in the first function block. A 5-pin or 8-pin USB connector is used for the external connector 166.

An electronic component device 176 is disposed on the other principal surface 60b of the first substrate 126, which is a region opposing the one principal surface 60a of the first substrate 126 on which the external connector 166 is mounted while sandwiching the first substrate 126 therebetween. In other words, the electronic component device 176 is mounted on the other principal surface 60b of the first substrate 126, which is a region on a side immediately under the surface where the external connector 166 is mounted. In the second embodiment, the electronic component device 176 is an electronic component device that generates a relatively high temperature heat. Although not illustrated, a heat dissipation member may be formed on a surface of the electronic component device 176 opposite to the mounting-surface of the first substrate 126. In this case, it is preferable that a surface on the opposite side of the heat dissipation member to the surface forming the electronic component device 176 be disposed so as to make contact with the housing 112.

In the wireless LAN module 110 according to the second embodiment, the heat that is generated in the electronic component device 176 is dissipated as follows. That is, the heat generated in the electronic component device 176 is transferred to the external connector 166 through the first substrate 126. Then, the heat transferred to the external connector 166 is dissipated, through the external connector 166, to an electronic apparatus to which the wireless LAN module 110 is connected.

With the wireless LAN module 110 according to the present invention, as described above, the heat generated in the electronic component device 176 is transferred to the external connector 166 through the first substrate 126, and then the transferred heat is dissipated, through the external connector 166, to an electronic apparatus to which the wireless LAN module 110 is connected. Accordingly, the heat generated in the electronic component device 176 can be efficiently dissipated.

Figure 5:
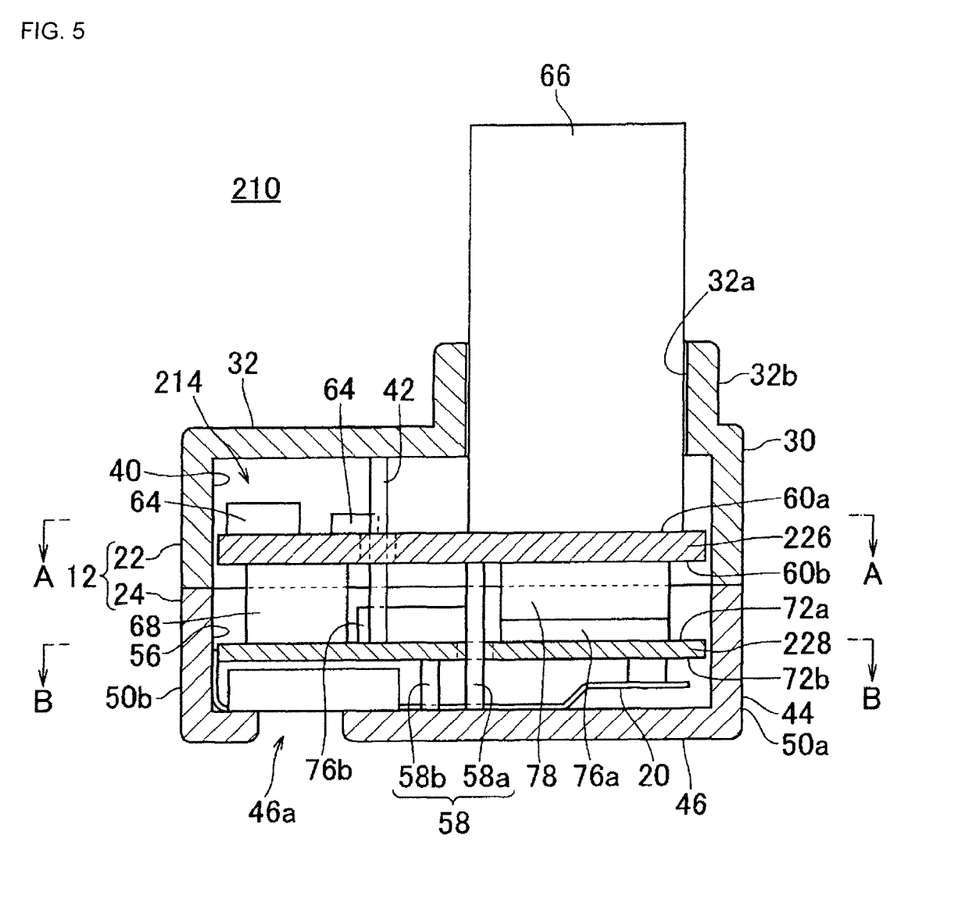
FIG. 5 is a schematic cross-sectional view of a wireless LAN module according to a third embodiment of the present invention.
Figure 6A:
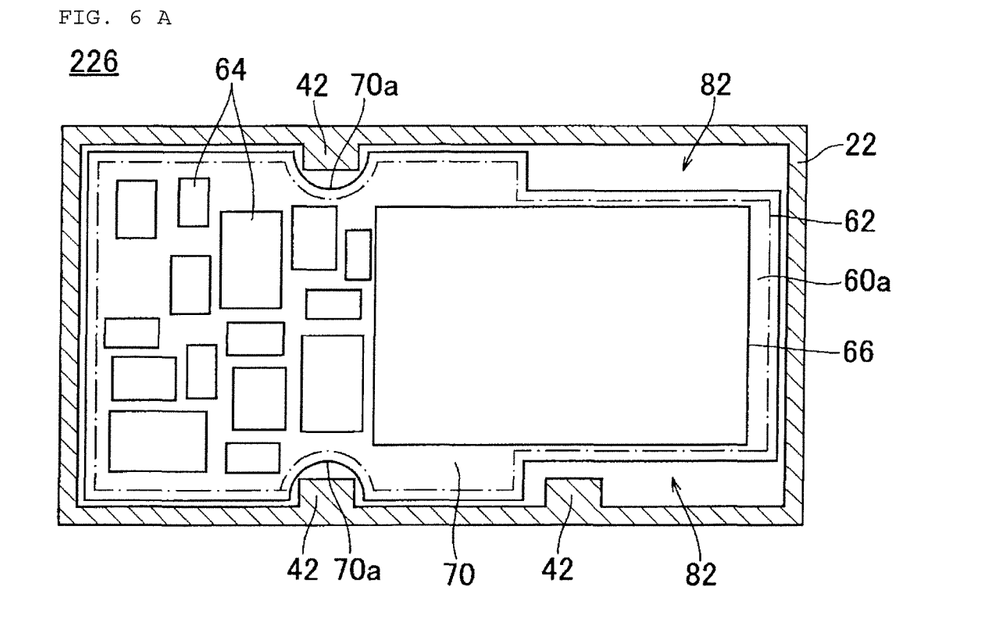
Figure 6B:
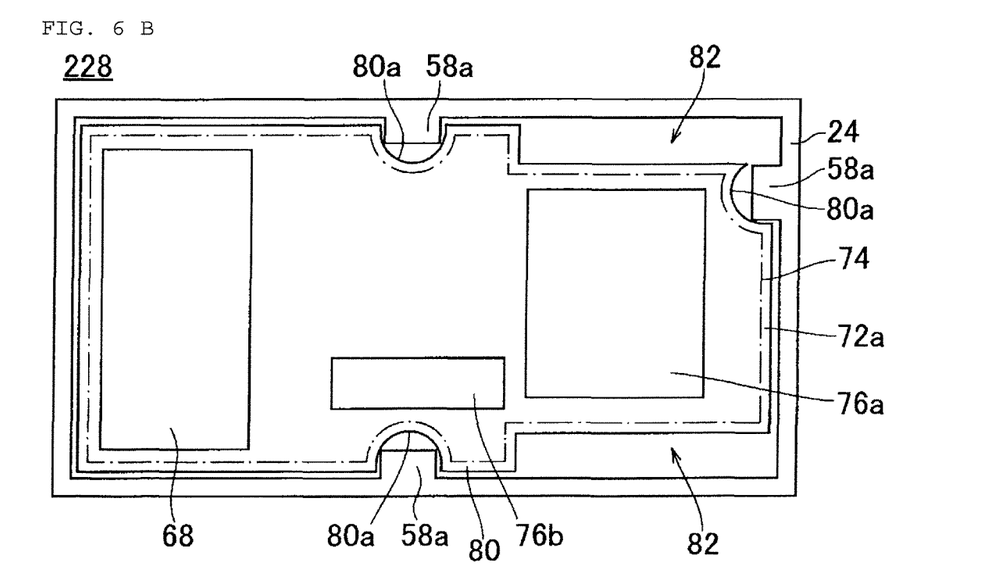
FIG. 6B is a cross-sectional plan view thereof taken along a B-B line in FIG. 5.

Next, a wireless LAN module according to a third embodiment of the present invention will be described. FIG. 5 is a schematic cross-sectional view of a wireless LAN module according to a third embodiment of the present invention, FIG. 6A is a cross-sectional plan view of the wireless LAN module taken along an A-A line in FIG. 5, and FIG. 6B is a cross-sectional plan view thereof taken along a B-B line in FIG. 5.

A wireless LAN module 210 shown in FIG. 5 includes at least the housing 12 and a substrate section 214. The wireless LAN module 210 further includes the button member 16, the lens member 18, and the antenna 20; however, these are the same as the button member, the lens member, and the antenna of the first embodiment, respectively. Therefore, the description thereof is omitted herein.

The housing 12 is provided at least to accommodate the substrate section 214. The housing 12 includes the first housing 22 and the second housing 24. Because the configuration of the housing 12 is the same as that of the housing described in the first embodiment, the description thereof is omitted herein. In addition, the description of the substrate-support projections 42 formed in the first housing 22 and the substrate-support projections 58 formed in the second housing 24 of the housing 12, which are configured to support the substrate section 214, is also omitted herein.

The substrate section 214 includes a first substrate 226 and a second substrate 228. The first substrate 226 and the second substrate 228 are formed with, for example, print substrates or the like. Because the configuration and the like of the first substrate 226, aside from the shape thereof, are the same as those of the first substrate 26 in the first embodiment, the description of the configuration and the like will be omitted herein. Further, because the configuration and the like of the second substrate 228, aside from the shape thereof, are also the same as those of the second substrate 28 in the first embodiment, the description of the configuration and the like will be omitted.

Further in the substrate section 214, as shown in FIG. 6A and FIG. 6B, cutouts 82 are respectively formed in the first substrate 226 and the second substrate 228 at portions in the vicinity of the electronic component device 76a that generates high temperature heat. Forming the cutouts 82 in the first substrate 226 and the second substrate 228 makes it possible to avoid the contact between the first and second substrates 226, 228 and the inner wall surface 40 of the housing 12. In the case where the heat dissipation member 78 is not disposed, the cutouts 28 may be formed only in the second substrate 228.

In the case where the heat generated from the electronic component device 76a is not sufficiently dissipated through the external connector 66, the housing is heated to be hot, which may raise problems as follows. That is, the wireless LAN module 210 is hard to be detached from the electronic apparatus to which the module has been attached, a fitting failure occurs between the groove 36a in the first housing 22 and the projecting edge portion 52a in the second housing 24, and so on. These problems are prominent when, in particular, the heat capacity of the housing 12 is small. Therefore, needed is a configuration in which the heat is transferred to the electronic apparatus through the external connector 66 while preventing the transfer of heat to the housing 12 as much as possible. With the wireless LAN module 210 according to the present invention, because the portions of the first substrate 226 and the second substrate 228 in the vicinity of the electronic component device 76a that generates high temperature heat are removed so as to provide the cutouts 82, the contact between the first and second substrates 226, 228 and the housing 12 can be avoided and the heat is thus unlikely to be transferred to the housing 12, thereby making it possible to remove the above problems.

Figure 7A:
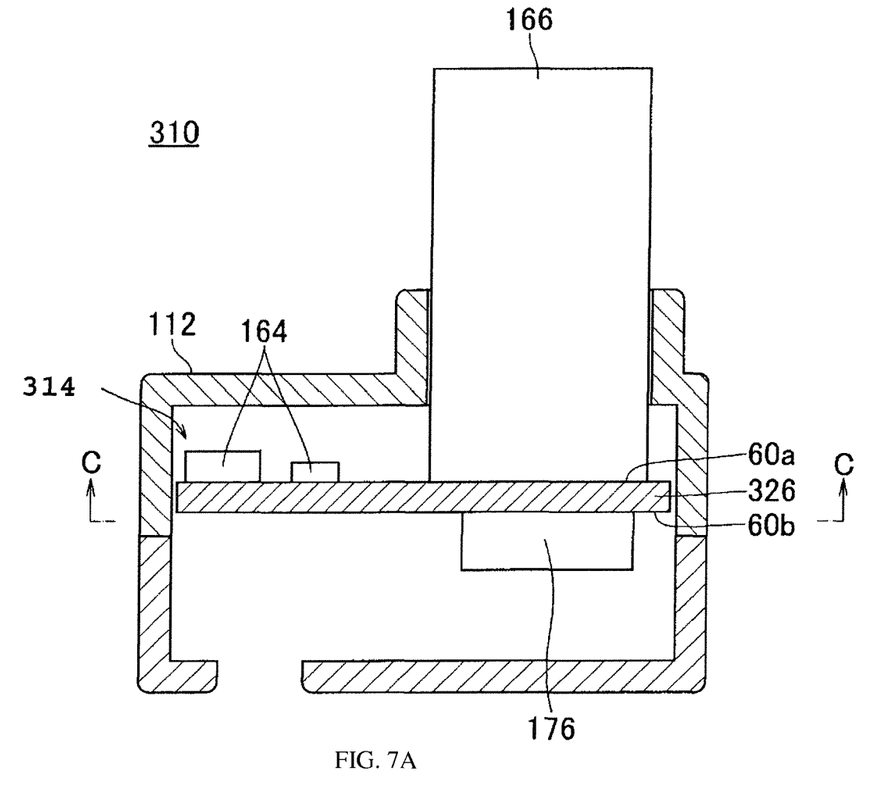
Figure 7B:
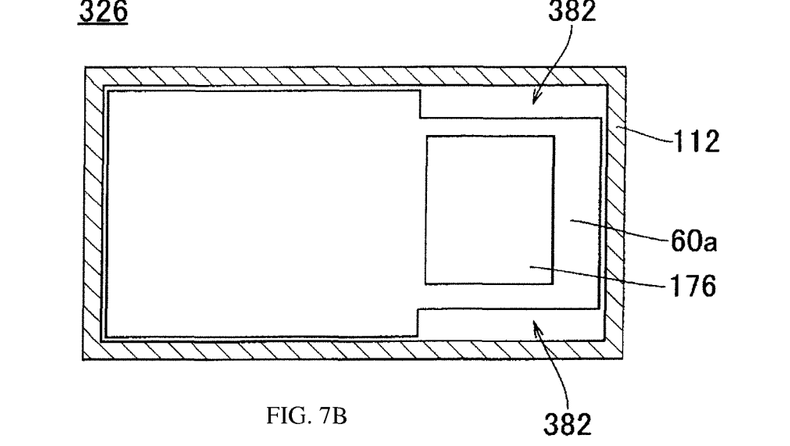
FIG. 7B is a cross-sectional plan view thereof taken along a C-C line in FIG. 7A.

Next, a wireless LAN module according to a fourth embodiment of the present invention will be described. FIG. 7A is a schematic cross-sectional view of a wireless LAN module according to the fourth embodiment of the present invention, while FIG. 7B is a cross-sectional plan view thereof taken along a C-C line in FIG. 7A.

A wireless LAN module 310 shown in FIG. 7A includes at least the housing 112 and a substrate section 314.

The housing 112 is provided at least to accommodate the substrate section 314. Since the configuration of the housing 112 is the same as that of the housing 12 in the first embodiment, the description thereof is omitted herein. In addition, the description of the substrate-support projections configured to support the substrate section 314 is also omitted.

The substrate section 314 includes a first substrate 326. The first substrate 326 is formed with, for example, a print substrate or the like. Because the configuration and the like of the first substrate 326, aside from the shape thereof, are the same as those of the first substrate 126 in the second embodiment, the description of the configuration and the like will be omitted herein.

In the substrate section 314, as shown in FIG. 7B, cutouts 382 are formed in the first substrate 326 at portions in the vicinity of the electronic component device 176 that generates high temperature heat. By forming the cutouts 382, the contact between the first substrate 326 and the inner wall surface of the housing 112 can be avoided.

Also in the wireless LAN module 310 according to the present invention, the portions of the first substrate 326 in the vicinity of the electronic component device 176 that generates high temperature heat are removed to provide the cutouts 382, so that the contact between the housing 112 and the first substrate 326 can be avoided. Accordingly, like in the case of the wireless LAN module 210, the heat generated from the electronic component device 176a is unlikely to be transferred to the housing 112.

In the wireless LAN module according to the above embodiments, although substrate-support projections configured to support the substrate section are formed in the housing, the invention is not intended to be limited thereto, and the substrate section may be supported by other configurations. Accordingly, although recesses through which the substrate-support projections are inserted and mounted are formed in the edge portion of the first substrate and second substrate of the substrate section in the wireless LAN module according to the above embodiments, the recesses may not be formed.

Furthermore, although the substrate section of the wireless LAN module according to the above embodiments is configured of one or two substrates, the invention is not intended to be limited thereto, and the substrate section may be configured of three or more substrates.

In the wireless LAN module according to the above embodiments, although the first function block is provided in the first substrate and the second function block is provided in the second substrate, the invention is not intended to be limited thereto. Further, in the wireless LAN module according to the above embodiments, although a power supply circuit is disposed in the first substrate and a digital circuit is disposed in the second substrate, the invention is not intended to be limited thereto, and a variety of modifications may be made thereupon.

In the wireless LAN module according to the above embodiments, although the first substrate is formed thicker in dimension than the second substrate, the invention is not intended to be limited thereto; the first substrate and the second substrate may be formed to have approximately the same thickness or the second substrate may be formed thicker than the first substrate.

The composite module according to the present invention can be used to such applications in which the module is connected to an electronic apparatus serving as a home electric appliance, an AV apparatus, or the like so as to provide an additional function to the stated electronic apparatus as desired.

10, 110, 210, 310 wireless LAN module
12, 112 housing
14, 114, 214, 314 substrate section
16 button member
18 lens member
18a lens
18b lens holder
20 antenna
20a button opening portion
20b lens opening portion
22 first housing
24 second housing
26, 126, 226, 326 first substrate
28, 228 second substrate
30 side surface portion
32 upper surface portion
32a connector opening portion
32b cylindrical portion
34a one side surface
34b the other side surface
36 opening portion
36a groove
38 accommodation section
40 inner wall surface
42 substrate-support projection
44 side surface portion 46 bottom surface portion
46a button opening portion
46b lens opening portion
48a one side surface
48b the other side surface
50a one end surface
50b the other end surface
52 opening portion
52a projecting edge portion
54 accommodation section
56 inner wall surface
58 substrate-support projection
58a first substrate-support projection
58b second substrate-support projection
60a one principal surface
60b the other principal surface
62 first function block
64, 164 electronic component device
66, 166 external connector
68 substrate joint connector
70 edge portion
70a recess
72a one principal surface
72b the other principal surface
74 second function block
76a, 76b, 176 electronic component device
78 heat dissipation member
80 edge portion
80a recess
82, 382 cutout

The invention claimed is:

1. A composite module comprising:
a first substrate having one principal surface and another principal surface;
a second substrate having one principal surface and another principal surface, wherein the one principal surface of the second substrate is opposed to the another principal surface of the first substrate;
a first electronic component device mounted on the one principal surface of the first substrate;
an external connector disposed in a region of the one principal surface of the first substrate other than an area where the first electronic component device is mounted;
a second electronic component device mounted on the one principal surface of the second substrate; and
a heat dissipation member disposed on the another principal surface of the first substrate, wherein the heat dissipation member is disposed on the second electronic component device and directly in contact with a surface of the second electronic component device opposite to a mounting-surface of the second electronic component device,
wherein the external connector is located vertically above the heat dissipation member and the second electronic component device through the first substrate.

2. The Composite module according to claim 1, further comprising:
a substrate joint connector configured to mechanically connect the first substrate and the second substrate together,
wherein the external connector is mounted on one end side of the first substrate, and
the substrate joint connector is disposed on another end side of the another principal surface of the first substrate.

3. The Composite module according to claim 1, wherein the heat dissipation member is so disposed as to make contact with both the surface of the second electronic component device opposite to the mounting-surface of the second electronic component device and the another principal surface of the first substrate.

4. The Composite module according to claim 1, further comprising an antenna and a housing,
wherein the housing accommodates the composite module and the antenna, and
an inner wall surface of the housing makes contact with the antenna via the composite module.

5. The Composite module according to claim 4,
wherein a cutout configured to prevent at least one of the first substrate and the second substrate from making contact with the inner wall surface of the housing is provided in at least one of the first substrate and the second substrate at a portion in a vicinity of the second electronic component device that is disposed in the region opposing the external connector while sandwiching the first substrate between the stated region and the external connector.

6. The Composite module according to claim 2,
wherein the heat dissipation member is so disposed as to make contact with both the surface of the second electronic component device opposite to the mounting-surface of the second electronic component device and the another principal surface of the first substrate.

* * * * *